United States Patent [19] [11] 4,056,761

Jacoby et al. [45] Nov. 1, 1977

[54] SONIC TRANSDUCER AND DRIVE CIRCUIT

[75] Inventors: Benjamin Franklin Jacoby, Columbus; Marvin E. Monroe, Sunbury, both of Ohio

[73] Assignee: Quintron, Inc., Columbus, Ohio

[21] Appl. No.: 612,358

[22] Filed: Sept. 11, 1975

[51] Int. Cl.[2] .......... H01L 41/10

[52] U.S. Cl. .......... 318/116; 310/26; 310/317; 318/118

[58] Field of Search .......... 310/8.1, 26; 318/116, 318/118; 323/8

[56] References Cited

U.S. PATENT DOCUMENTS

| | | | |
|---|---|---|---|
| 2,745,998 | 5/1956 | McPherson, Jr. | 318/118 |
| 2,752,512 | 6/1956 | Sarratt | 318/116 |
| 3,166,639 | 1/1965 | Babb | 323/8 |
| 3,447,051 | 5/1969 | Attwood et al. | 310/8.1 X |
| 3,701,903 | 10/1972 | Merhar | 310/8.1 X |
| 3,931,533 | 1/1976 | Kaso et al. | 310/8.1 |
| 3,967,143 | 6/1976 | Watanabe et al. | 310/8.1 |

*Primary Examiner*—Donovan F. Duggan
*Attorney, Agent, or Firm*—Frank H. Foster

[57] ABSTRACT

A sonic transducer, having a drive electromechanical transducing element and a pickup electromechanical transducing element or a single transducing element electronically operating as both, is excited through suitable power amplifiers by a voltage controlled oscillator. A phase comparator connected to these transducing elements detects the phase difference between stress and strain in the transducer. Its output is connected to an integrator circuit means which integrates the phase difference signal and applies the integrated signal to control the voltage controlled oscillator. The maximum and minimum values of the voltage which is applied to control the oscillator are independently limited by a pair of diodes connected to sources of two different voltages. An adjustably fixable phase shift circuit is interposed between the pickup transducing element and the phase comparator to permit calibration of the system for optimal operation. Amplifier and clipper circuitry interposed between the phase shift circuit and the phase comparator circuit make the oscillator output signal independent of the amplitude of the vibrations of the sonic transducer.

13 Claims, 4 Drawing Figures

SONIC TRANSDUCER AND DRIVE CIRCUIT

BACKGROUND OF THE INVENTION

This invention relates generally to sonic tools and more particularly relates to improvements in the system for exciting such tools.

A sonic tool is a device which is excited into mechanical vibration at sonic or ultrasonic frequencies in order to perform useful work. Such tools are used for heating, drilling, cutting, sawing or deforming a work piece. Sometimes the tool is provided with a variety of interchangeably attachable tool members.

Sonic tools generally consist of an electronic drive circuit which generates electronic oscillations for exciting a sonic transducer to which the tool member is mounted.

A sonic transducer typically comprises an elongated metallic body with an interposed magneto-strictive transducing element or an interposed piezoelectric transducing element which is excited by electronic drive circuitry. The transducing elements advantageously consist of a stack of piezoelectric wafers which are mounted coaxially with the driven metallic portion of the sonic transducer and biased under longitudinal compression. Such a stack arrangement is illustrated in U.S. Pat. No. 3,889,166.

Electrical excitation of the drive transducing element generates mechanical compression waves which, at the natural frequency of vibration or resonance of the entire body, produce a standing wave pattern along the longitudinal axis. This standing wave pattern defines nodes and antinodes along the mechanical body. The nodes are positions of maximum strain or deformation and minimum axial, linear displacement of the vibrating body. The antinodes are positions of minimum strain and maximum reciprocating displacement. Sonic tools are therefore ordinarily designed so that a piezoelectric transducing element is positioned at a node and the working surface of the tool member is positioned at an antinode.

Various problems arise with the design of such tools. One of the chief problems arises because the frequency, which is necessary to excite the tool in a manner which gives a maximum displacement at the working surface of the tool member, shifts as the tool is loaded by contact with the workpiece and may also shift as a result of the use of different interchangeable tool members or tips. It has furthermore been observed that not only is the frequency of resonance shifted by loading but further that most sonic tools have, in addition to the desired frequency of resonance, several spurious or parasitic resonant frequencies. These are not useful because they generate greatly reduced displacement of the working surface of the tool member.

Therefore, many different electronic driving circuitry systems and schemes have been proposed for controlling and modifying the excitation frequency of the sonic transducer of the sonic tool during use. All these problems are further complicated by the high quality factor or Q exhibited by sonic transducers.

One prior art system which has been proposed for controlling the excitation frequency of the circuit driving a sonic transducer is to design the entire sonic tool as an oscillator. A sonic transducer is energized with an amplifier which includes the sonic transducer as the frequency determining element in a feedback loop to provide the closed loop necessary for a conventional oscillator. Such a system is designed on the theory that is is basically a conventional oscillator but has the sonic transducer in the feedback loop instead of the usual tuned circuit constructed of electronic elements. Such systems are shown in U.S. Pat. Nos. 3,474,267 and 3,813,616.

However, such feedback systems require the inclusion of an electronic bandpass filter in the closed loop so that the tool can not be excited at the spurious, unwanted resonant frequencies. Such filters must exhibit a narrow bandpass but in addition to their sharply peaked amplitude characteristic they unfortunately also exhibit an undesirable phase shift characteristic. While exhibiting zero phase shift at its center frequency, the filter will introduce a frequency dependent phase shift into the circuit loop at frequencies removed from the center frequency. This phase shift will be between $+90°$ and $-90°$.

According to conventional oscillator theory, a total 360° phase shift is required around the closed loop for resonance. The tool will therefore be driven at the frequency which gives a 360° total phase shift around the loop. This is the resonant frequency of the entire closed loop rather than the natural frequency of vibration or resonant frequency of the sonic transducer itself. Consequently, the phase shift introduced in the electronic circuit by the filter causes excitation at a frequency removed from the resonant frequency of the mechanical system. The ultimate result is a reducted or zero amplitude or displacement at the working region of the sonic tool.

Other systems attempts to control the excitation frequency by monitoring and comparing the phase relationship between the voltage and current at the drive transducing element by which the mechanical vibrations are generated. Such systems are illustrated by U.S. Pat. Nos. 2,917,691; 3,778,648; and 3,819,961.

These systems operate under the assumption that, at the mechanical resonant frequency of the body, the voltage and current exhibited at the drive transducing element will be in phase and consequently exhibit electrical resonance. Simply stted, these systems assume that mechanical resonance and electrical resonance observed at the electrodes of the drive transducing elements are coincident.

It has been found that, while this assumption is correct when a sonic transducer is not loaded and consequently is doing no work, the assumption in incorrect as the tool is loaded down. In fact it has been found that the frequency of mechanical resonance and the frequency of electrical resonance progressively diverge as the tool is progressively loaded. Consequently, the system becomes progressively less effective as the tool is loaded because it excites the sonic transducer at its exhibited electrical resonance rather than at its mechanical resonance. We have found that, as such tools are loaded, the displacement of the working surface of the tool is reduced and ultimately ceases.

The prior art has also taught a variety of other circuit systems for exiciting a sonic transducer including systems for hunting the resonant frequency. There is however, a need for a system which will permit the sonic transducer to be energized at the resonant frequency of its mechanical body as that resonant frequency is caused to shift under load rather than being energized at some ineffective approximation to the mechanical resonant frequency.

SUMMARY AND OBJECTS OF THE INVENTION

It is therefore a primary object of the present invention to provide a sonic tool which is always excited at the mechanical resonance of the sonic transducer as the mechanical resonance shifts under changing load conditions so that the tool will vibrate at the frequency which maximizes the displacement of the work region of the tool member or tip.

Another object of the invention is to avoid excitation of the tool at spurious resonant frequencies which would produce reduced or minimal tip displacement.

Yet another object of the invention is to provide a means for confining the excitation frequency to a narrow band without introducing phase shift into the closed loop of the system.

Yet another object of the invention is to provide a sonic tool which is excited by an excitation amplitude which is substantially independent of the vibration amplitude of the sonic transducer.

The present invention contemplates the excitation of a sonic transducer by a signal controlled oscillator which is operable over a frequency range including the useful resonant frequencies of the transducer. The phase difference between stress and strain in the transducer is detected and the phase difference signal is integrated and used to control the oscillator. The excitation frequency of the sonic transducer is confined to a narrow band which includes the useful mechanical resonant frequencies by limiting the excursions of the integrated phase difference signal to within selected limits.

Further objects and features of the invention will be apparent from the following specification and claims when considered in connection with the accompanying drawings illustrating the preferred embodiment of the invention.

Figure 1:
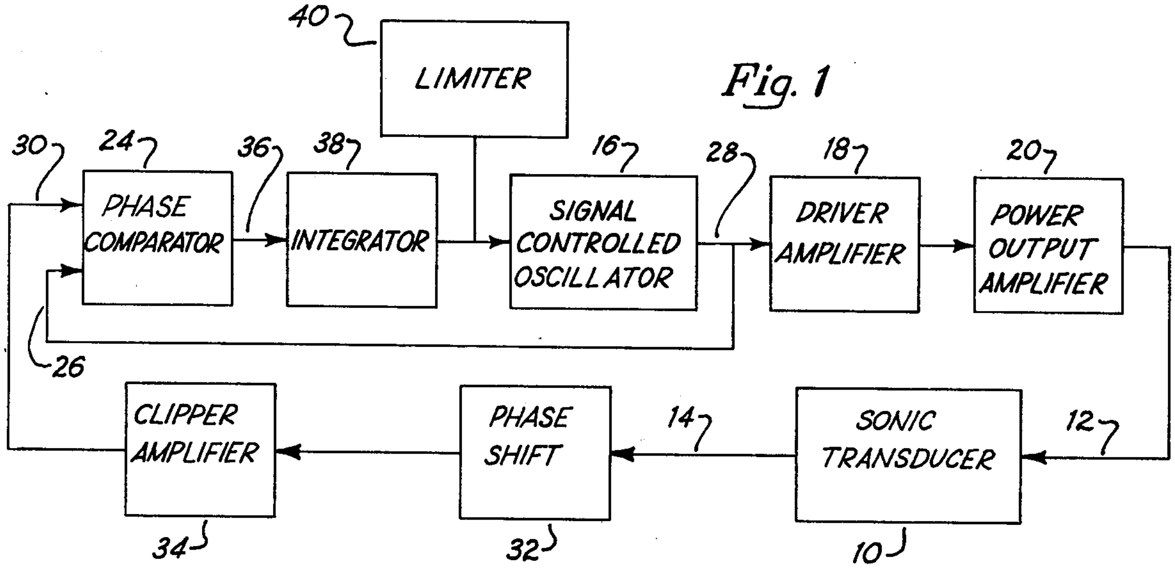
FIG. 1 is a block diagram illustrating the entire sonic tool embodying the present invention.

In describing the preferred embodiments of the invention illustrated in the drawings, specific terminology will be resorted to for the sake of clarity. However, it is not intended to be limited to the specific terms so selected and it is to be understood that each specific term includes all technical equivalents which operate in a similar manner to accomplish a similar purpose. For example, the term connection is not necessarily confined to direct connection but includes effective connection through other elements where such connection is known as being equivalent by those skilled in the art.

DETAILED DESCRIPTION

FIG. 1 illustrates a block diagram embodying the present invention. The interconnected electronic circuitry is provided for driving a sonic transducer 10 in mechanical oscillation at the resonant frequency of the sonic transducer 10. A substantial number of sonic transducers are known in the art and most may be driven or adapted to be driven in a manner embodying the present invention.

The sonic transducer may, for example, comprise a power driven osteotome such as that illustrated in U.S. Pat. No. 3,889,166 and in other U.S. Patents. The sonic transducer used in embodiments of the present invention has a pair of transducing elements. One element is a drive transducing element to which power is applied for driving the transducer and which is provided with power input electrodes 12. Another element is a pickup transducing element having electrodes 14. The transducing elements may comprise piezoelectric wafers or other materials or devices which have been illustrated in the prior art for suitably transducing between mechanical and electrical energy.

The sonic transducer 10 is driven by an electrical, oscillatory signal generated by a signal controlled oscillator 16, the output of which is increased in amplitude and power by the driver amplifier 18 and power output amplifier 20.

The oscillator 16, which may for example be a conventional voltage controlled oscillator, has its frequency controlled by the magnitude of the electronic signal applied at its input 22.

The signal for controlling the oscillator 16, and consequently for controlling the oscillator frequency, is derived from a phase comparator circuit 24 which provides an output signal which is proportional to the phase difference between the electronic signal applied to the drive transducing element of the sonic transducer 10 and the electronic signal from the pickup transducing element of the sonic transducer 10.

The signal applied to the drive transducing element of the sonic transducer 10 could, with suitable gain or attenuation and inversion if needed, be derived from any point between the output of the oscillator 16 and the power drive input electrodes 12 and be applied to the input 26 of the phase comparator 24. It has been found most desirable, however, to apply the drive transducing element signal as found at the output 28 of the controlled oscillator 16.

The signal from the pickup transducing element which appears at the electrodes 14 of the sonic transducer 10 is applied to the input 30 of the phase comparator 24 after being modified by an adjustably fixed phase shift circuit 32 and a clipper amplifier circuit 34.

The phase shift circuit 32 is a conventional phase shift circuit which is adjustable in order to introduce a mall adjustably fixed phase angle into the circuitry for initial calibration or tuning of the circuitry. The fixed phase shift circuit 32 compensates for the departure of various circuit elements from their ideal phase shift conditions and for the necessary different physical positioning of the drive transducing element and the pickup transducing element. Under ideal conditions the phase shift introduced by the phase shift circuit 32 can be considered as zero degrees. In practical applications however it has been found that the necessary phase shift compensation may vary considerably from circuit to circuit depending upon the phase shift of the elements of the circuit and their net cumulative effect.

The clipper amplifier circuit functions to sufficiently amplify the signal from the electrodes 14 of the pickup transducing element to drive the later stages of the clipper amplifiers into saturation so that the output of the clipper amplifier 34 is essentially a square wave derived from the sinusoidal oscillations of the sonic transducer 10.

Therefore the output 36 of the phase comparator 24 has a magnitude which is directly proportional to the phase difference between the signal applied to the drive transducer element and the signal from the pickup transducing element of the sonic transducer 10.

The output 36 of the phase comparator 24 is applied to the input of an integrator circuit means 38 which may, for example, comprise a conventional RC integrator but preferably is of more advanced design. The magnitude of the output signal from the integrator 38 controls the frequency of the oscillator 16. A limiter circuit 40, however, is connected to the output of the integrator 38 for limiting its excursions to thereby confine the oscillator frequency within a selected range of frequencies.

The operation of the circuit illustrated in FIG. 1 may be illustrated by assuming that it is connected with a sonic transducer 10 having a desirable resonant frequency when unloaded at 25 KHz for example. Such a transducer may also be found to inherently have undesirable resonant frequencies at 20 and 30 KHz at which useful displacement of the working region of the tool member or tip is greatly reduced or nonexistent.

The circuitry is energized so that the output signal of the oscillator 16 will begin exciting the sonic transducer 10. The signal from the electrodes 14 of the pickup transducing element is applied through the phase shift circuit 32 and clipper amplifier 34 to the phase comparator 24 as is the signal at the output of the oscillator 16 which is simultaneously applied to the drive transducing element electrodes 12 of the sonic transducer 10. The signal at the output 36 of the comparator 24 will have a magnitude which is directly proportional to the phase difference between the drive signal applied to the drive electrodes 12 and the pickup signal from the pickup electrodes 14.

Although, under initial conditions, it is unlikely that these will be in phase, if they were the output of the phase comparator 24 will be zero and consequently the output of the integrator 38 will not shift in either an increasing or a decreasing direction. More likely however, there will be a phase error and consequently the integrator circuit means 38 will begin integrating the output of the phase comparator 24 so that the output of the integrator 38 will begin an excursion in a positive or negative direction.

This excursion will in turn cause the oscillator frequency to increase or decrease in a direction which tends to bring the signals into phase. As these signals are brought into phase, the output of the phase comparator 24 decreases until the signals are finally brought into phase whereupon the output of the integrator circuit means 38 reaches a steady state level. The oscillator will generate oscillations at the frequency determined by this steady state load.

As is known in the art, loading of the sonic transducer 10 will cause a shift in its mechanical resonant frequency. Such a shift in its mechanical resonance will again cause a phase shift signal to appear at the output 36 of the phase comparator 24. This difference will be integrated by the integrator circuit means 38 to shift the frequency of the controlled oscillator 16 to again bring the drive signal and pickup signal at electrodes 12 and 14 into phase.

Therefore it can be seen that whatever reasonable loading of the sonic transducer 10 occurs and therefore whatever the shift in its mechanical resonant frequency, the circuitry of the present invention shifts the oscillator frequency to bring the drive signal and pickup signal into phase.

The effect of bringing these signals into phase is to operate the mechanical system so that its stress and strain are in phase which are the conditions of mechanical resonance. Stress, the force applied per unit area to the transducer, is of course related to the force applied to the mechanical system by the drive transducing element which, if it consists of piezoelectric wafers, is the result of the high voltage applied to its electrodes. Strain, the actual deformation of the mechanical system as a result of this force, is derived from the electrical signal at the electrodes 14 which is generated by the deformation of the pickup piezoelectric wafers. Thus, the embodiment of the invention derives its frequency from the stress and stain phase relationship of the mechanical system system and applies a frequency to bring stress and strain in phase with each other which is the condition for true mechanical resonance. The circuitry does not respond to the voltage and current phase relationship at the electrodes 12 of the drive transducing element. The voltage and current phase is indicative of electrical rather than mechanical resonance.

In order to prevent the sonic transducer from being excited at a frequency which causes the spurious oscillations which are inherent characteristics of all sonic transducers, the limiter circuit 40 limits the excursions of the output of the integrator circuit means 38 to confine it within a frequency range which excludes the undesired spurious resonant frequencies. For example, the limiter may be adjusted so that the excursions at the integrator output are confined between input voltages at the input 22 of the oscillator 16 which correspond to 23 KHz and 28 KHz. Consequently, the limiter has an effect similar to a bandpass filter with exceptionally steep boundaries.

Therefore, in summary the circuitry of FIG. 1 operates by exciting a sonic transducer with a signal controlled oscillator which is operable over a frequency range which includes all the desired resonant frequencies at which the sonic transducer might operate in a useful manner. The phase difference between stress and strain in the transducer is detected to obtain a signal proportional to the phase difference. Under ideal conditions, with the stress and strain determined at essentially the same position on the mechanical device, the output signal representing the phase difference is integrated about zero and the integrated signal is applied to control the signal controlled oscillator. Unwanted resonant frequencies are avoided by limiting the excursions of the integrated phase difference signal to confine the signal within selected limits.

Of course, since stress and strain are not conveniently measurable at the identical same position along the transducer and because all electronic circuitry characteristically contributes a non-ideal phase shift, the circuit incorporates an adjustable phae shift network so that in effect the phase difference signal is integrated about the selected phase difference of the phase shift network. Of course, it will become apparent that the pickup and drive transducing elements theoretically could be substantially spaced within the tool with the phase shift network 32 being appropriately readjusted to compensate for the phase difference resulting from such physical spacing.

Figure 2:
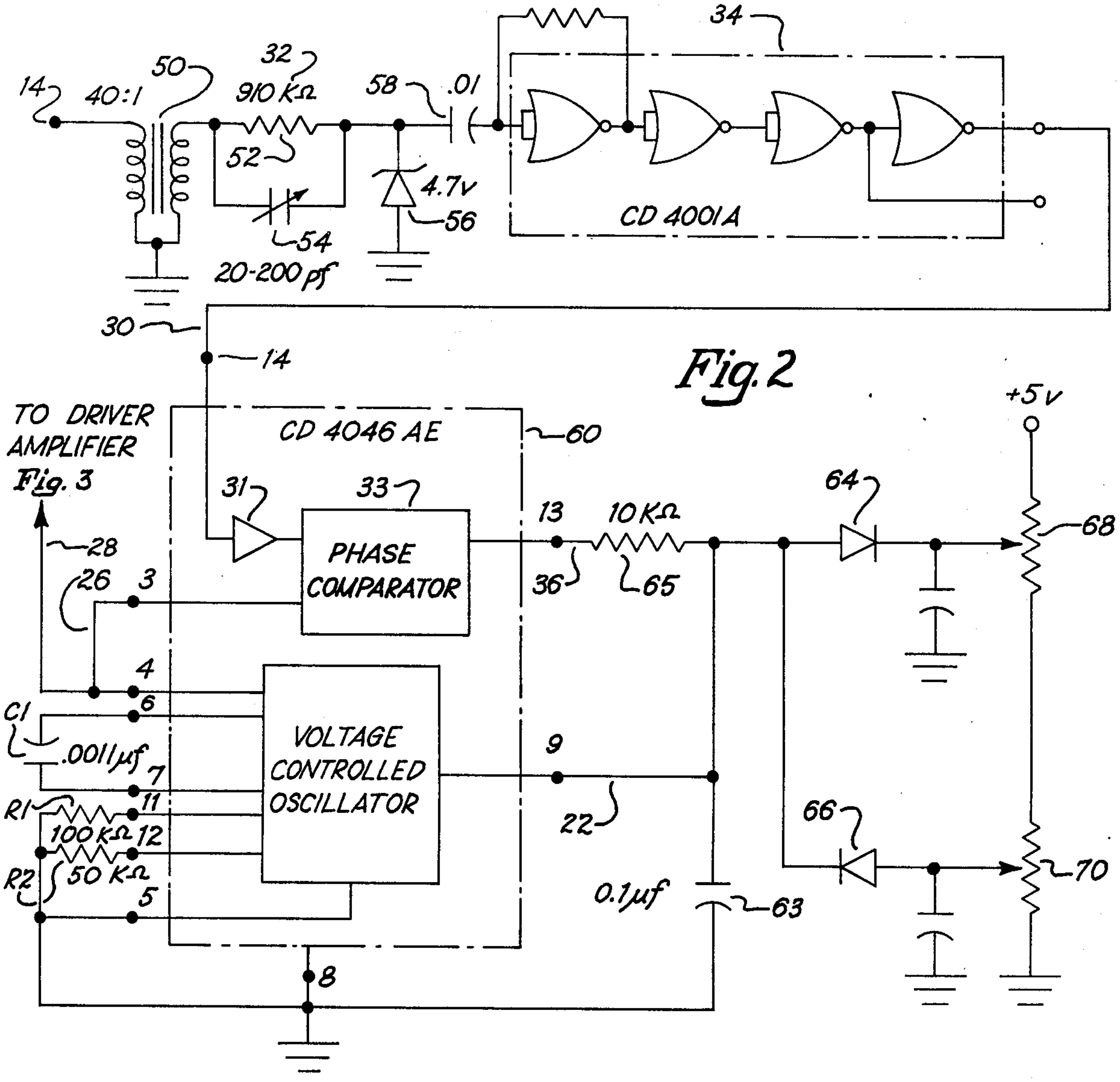
FIG. 2 is a schematic diagram of the circuitry interposed between the output of the pickup transducing element of the sonic tool and input of the driver amplifier which are illustrated in FIG. 1.

FIG. 2 illustrates in detail the preferred circuitry interposed between the pickup electrodes 14 of the sonic transducer 10 and the output 28 of the signal controlled oscillator 16.

The output 14 from the pickup electrodes for the pickup transducing element is applied to a voltage reducing transformer 50 which reduces the output from the piezoelectric wafers to voltage levels, of around 10 volts, at which the semi-conductor circuitry can operate. The output of the transformer 50 is applied to the phase shift network 32 which comprises a resistance 52 and an adjustable capacitance 54. The output of the phase shift network 32 is shunted by a zener diode 56 to provide overvoltage protection so that transients or mechanical oscillations of excessive amplitude can not damage the subsequent circuitry.

The signal from the phase shift network 32 is coupled by coupling capacitor 58 to the clipper amplifier 34. The preferred clipper amplifier 34 comprises a RCA COS/MOS integrated circuit number CD 4001 A which consists of four nor gates on a single chip and connected in cascade. Their inputs are connected together to form amplifiers in the conventional manner each of which have a gain of about 30.

The phase comparator 24, integrator 38 and controlled oscillator 16 may advantageously be formed from RCA COS/MOS integrated circuit number CD 4046 AE, although other integrated circuits and circuits formed of discrete components may also be used. The preferred integrated circuit CD 4046 AE illustrated at 60 includes some elements which are not used in the embodiment of the present invention and consequently are not shown in FIG. 2.

As more completely explained in the 1975 Data Book Series, published by RCA number SSD-203C, the frequency range of the voltage controlled oscillator 62 is determined by resistors R1 and R2 and by capacitance C1. FIG. 2 shows not only the pin numbers for the integrated circuit but additionally shows reference numerals corresponding to the inputs and outputs illustrated in FIG. 1.

The components of the integrated circuit CD 4046 AE are connected substantially as shown in FIG. 1 with the exception that an amplifier 31 is interposed between the input 30 of the phase comparator 33 and with the further exception that the phase comparator and the voltage controlled oscillator of the integrated circuit are designed to inherently include the integrating function.

The preferred limiter circuit which is connected at the input 22 of the voltage control oscillator 62 comprises a pair of diodes 64 and 66 having an unlike terminal of each, the anode of diode 64 and cathode of diode 66, connected to the input 22 of the voltage controlled oscillator 62. The other terminal of each diode is connected to sources of two different voltage levels fromed by a voltage divider consisting of potentiometers 68 and 70.

Therefore, when the voltage applied to the input 22 of the oscillator exceeds the voltage setting of the potentiometer 68, diode 64 will begin conducting and prevent a further increase of applied voltage. Similarly, when the voltage applied to the input 22 is reduce below the voltage to which the potentiometer 70 is set, diode 66 will begin conducting so that the voltage can go no lower. In this way, the excursions of the control voltage applied to the input terminal 22 of the voltage controlled oscillator 62 is confined within the limits determined by the setting of potentiometers 68 and 70.

While there are a number of ways to limit the frequency range of the voltage controlled oscillator, it is particularly advantageous to use the diode method when the diodes are connected to the capacitor 63 which together with resistor 65 form a low pass filter. In this way the voltage on this capacitor 63 is not allowed out of the range of useful operation hence startup time is reduced. Otherwise the phase comparator signal must first bring this voltage into the proper range and then bring the oscillator onto the proper frequency.

Figure 3:
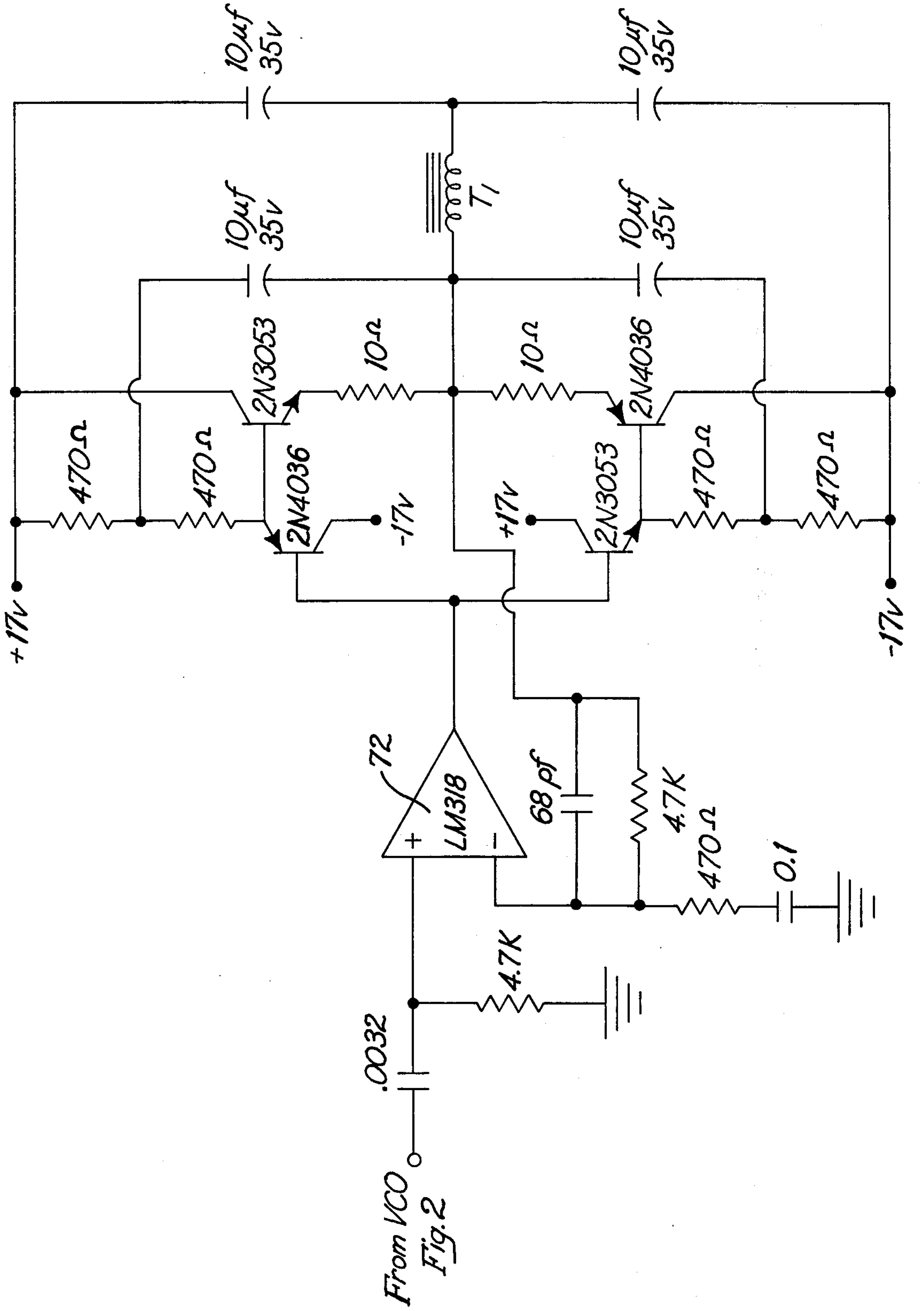
FIG. 3 is a schematic diagram of the driver amplifier illustrated in FIG. 1.
Figure 4:
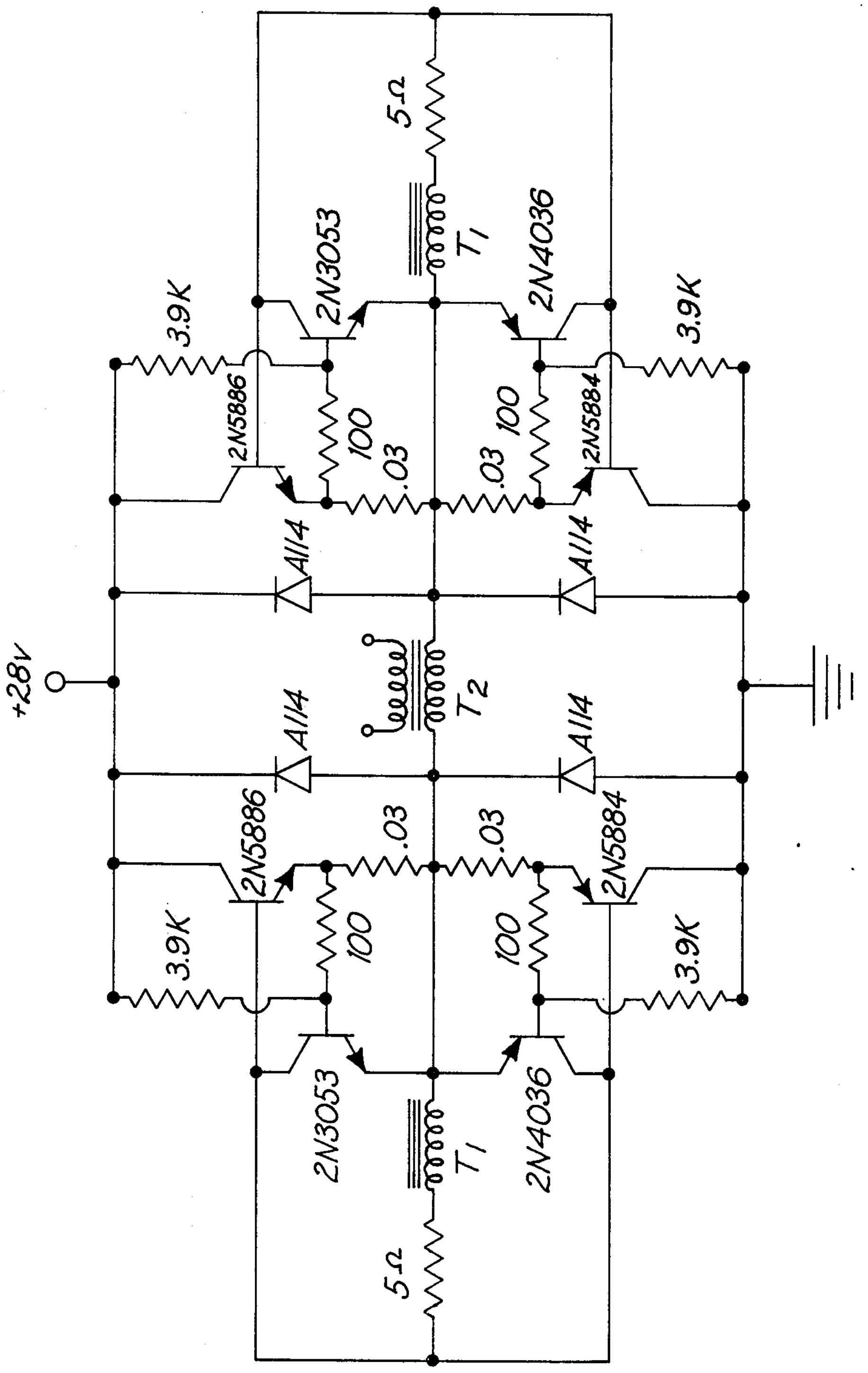
FIG. 4 is a schematic diagram of the power output amplifier in FIG. 1.

The amplifiers of FIG. 3 and FIG. 4 are shown but not described in detail because they may be of design well known in the art. The preferred amplifier illustrated in FIG. 3 comprises an input stage utilizing an op-amp 72 followed by a subsequent push-pull amplifier having an output which is applied to transformer T1 and coupled to transformer T1 into the power amplifier stage illustrated in FIG. 4.

Transformer T1 has a pair of secondaries to provide two balanced push-pull inputs to the power amplifier stage illustrated in FIG. 4. This balanced, push-pull amplifier has an output applied to a transformer T2 which increases its output voltage to apply a voltage of suitable magnitude to the piezoelectric drive transducing elements of the sonic transducer 10.

Therefore, from the above it can be seen that a sonic tool has been provided which includes a sonic transducer which is always driven at its mechanical resonance regardless of shifts in the resonant frequency of the mechanical system and yet which is prevented from being excited at frequencies corresponding to spurious resonance frequencies.

Although the invention has so far been described in terms of two separate transducing elements, a drive transducing element and a pickup transducing element, the same operational effect can be accomplished by using a single transducing element to serve both functions. Thus, the transducing means contemplated by the present invention can consist alternatively of either two separate transducing elements or a single element combined with some means to make the single element perform both functions.

A single element can be made to perform both as the drive element and the pickup element in at least two different ways which might be referred to as time sharing and balancing.

In the time sharing system a drive signal such as a drive voltage is applied to the transducing element for a relatively minor portion of each cycle. During the major portion of each cycle the drive signal is not applied and the signal produced by the transducing element due to is strain is monitored. This could for example, be accomplished by suitable electronic switching circuitry which can be designed according to known techniques.

A preferred technique, however, is to add a third winding on the transformer T2 of FIG. 4. This winding will be a low voltage winding (i.e. with relatively fewer turns) and is connected in place of the secondary of transformer 50 in FIG. 2 in order to apply its voltage to the input of the phase shift circuit 32.

In this manner the voltage applied to the phase shift circuit will represent the voltage of the transducing element.

The power amplifier 20 is then modified according to known techniques so that its output is a large pulse of short duration relative to one cycle; that is it will apply large pulses of short duty cycle of, for example, 20% or less, to the transducing element.

These pulses will cause the transducing element to apply a mechanical stress to the sonic transducer during their occurrences somewhat analagously to a short push on a pendulum. However, during the remaining 80% or more of the cycle the drive circuit will be switched off (to be an open circuit) and the signal on the transducing element will be due to the strain of the element.

This strain-produced signal will be the pickup signal received at the additional winding and after all but negligible effects of the drive pulse are removed by the clipper amplifier it will permit the circuit to function as it does with two transducing elements.

The balance system can be applied by adapting the techniques used in the Wheatstone bridge type of hybrid circuit commonly used in telephony.

For example a Wheatstone bridge can be constructed and balanced with the transducing element as one of the four bridge elements. The other three bridge elements are impedances which are selected to balance the bridge. The drive signal is applied across one pair of opposite nodes of the bridge and the pickup signal will appear across the other pair of opposite notes from which it is coupled to the phase shift circuit.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

What is claimed is:

1. A sonic tool comprising:

a. a sonic transducer including electromechanical transducing means for the application of a periodic electronic drive signal thereto to produce a mechanical stress for driving said transducer and for generating an electronic pickup signal which is proportional to mechanical strain;

b. a phase comparator having an output signal proportional to the phase difference of a pair of periodic signals at a pair of inputs, one input connected to receive the electronic drive signal applied to said transducing means and the other input connected to receive the electronic pickup signal from said transducing means;

c. integrator circuit means having its input connected to the output of said phase comparator;

d. an electronic signal controlled oscillator having its input control terminal connected for control by the output of said integrator circuit means and its output connected for exciting said transducing means with said drive signal;

e. limiter circuit means connected to the input control terminal of said oscillator for limiting the escursions of the control signal to confine it within a selected range; and f. an adjustable phase shift network means and amplitude limiting circuit means electrically interposed in cascade between said transducing means and said phase comparator for introducing a selected phase shift in said pickup signal and for making the input pickup signal applied to said phase detector independent of the amplitude of the pickup signal from said transducing means.

2. A sonic tool according to claim 1 wherein a power amplifier is interposed and connected between the output of said oscillator and said drive transducing element.

3. A tool according to claim 2 wherein said oscillator is a voltage controlled oscillator.

4. A tool according to claim 3 wherein said limiter circuit means comprises a pair of diodes having an unlike terminal of each connected to said control terminal and the other terminal of each connected to sources of two different voltage levels.

5. A sonic tool according to claim 1 wherein said transducing means comprises a drive electromechanical transducing element connected for the application thereto of said drive signal and a pickup transducing element connected to the pickup signal input of said comparator.

6. A sonic tool comprising:

a. a sonic transducer including electromechanical transducing means for the application of a periodic electronic drive signal thereto to produce a mechanical stress for driving said transducer and for generating an electronic pickup signal which is proportional to mechanical strain;

b. a phase comparator having an output signal proportional to the phase difference of a pair of periodic signals at a pair of inputs, one input connected to receive the electronic drive signal applied to said transducing means and the other input connected to receive the electronic pickup signal from said transducing means;

c. integrator circuit means having its input connected to the output of said phase comparator;

d. an electronic signal controlled oscillator having its input control terminal connected for control by the output of said integrator circuit means and its output connected for exciting said transducing means with said drive signal;

wherein said transducing means comprises a transducing element and time sharing means for applying a driving signal from said oscillator during a minor part of each cycle and for applying said pickup signal from said transducing element to said phase comparator during another part of each cycle.

7. A sonic tool according to claim 6 wherein said time sharing means includes a transformer with a pair of windings having relatively fewer turns one for the application of said signal and the other for the pickup of said pickup signal and having a winding with relatively more terms connected to said transducing element.

8. A sonic tool according to claim 6 further comprising:

a. a limiter circuit means connected to the input control terminal of said oscillator for limiting the excursions of the control signal to confine it within a selected range; and b. an adjustable phase shift network means and amplitude limiting means electrically interposed in cascade between said pickup winding element and said phase comparator for introducing a selected phase shift in said pickup signal and for making the input pickup signal applied to said phase detector independent of the amplitude of the pickup signal from said pickup transducing element.

9. A sonic tool comprising:

a. a sonic transducer including electromechanical transducing means for the application of a periodic electronic drive signal thereto to produce a mechanical stress for driving said transducer and for generating an electronic pickup signal which is proportional to mechanical strain;

b. a phase comparator having an output signal proportional to the phase difference of a pair of periodic signals at a pair of inputs, one input connected to receive the electronic drive signal applied to said transducing means and the other input connected to receive the electronic pickup signal from said transducing means;

c. integrator circuit means having its input connected to the output of said phase comparator;

d. an electronic signal controlled oscillator having its input control terminal connected for control by the output of said integrator circuit means and its output connected for exciting said transducing means with said drive signal;

wherein said transducing means comprises a transducing element and balancing means connected to said transducing element, the output of said oscillator and the pickup signal input of said phase comparator for coupling said drive signal to said transducing means and for coupling said pickup signal to said phase comparator.

10. A sonic tool according to claim 9 wherein said balancing means comprising a bridge circuit.

11. A sonic tool according to claim 9 wherein said balancing means comprises a hybrid transformer.

12. A method for exciting a sonic transducer, the method comprising:

a. exciting said sonic transducer by a signal controlled oscillator operable over a limit frequency range including the desired resonant frequencies of said transducer;

b. detecting a signal which is proportional to mechanical strain;

c. shifting the phase of said strain signal;

d. clipping said strain signal to eliminate amplitude variations;

e. detecting the phase difference between the excitation signal from said controlled oscillator and the clipped and phase shifted strain signal to obtain a signal proportional to said phase difference;

f. integrating said phase difference signal about a selected phase difference; and g. controlling said oscllator with said integrated phase difference signal.

13. A method according to claim 12 further comprising the step of limiting said frequency range by limiting the excursions of said integrated phase difference signal to within selected limits.

* * * * *